United States Patent
Loseu et al.

(10) Patent No.: US 7,521,837 B1
(45) Date of Patent: *Apr. 21, 2009

(54) SAW ARCHITECTURE WITH SERIES CONNECTED INTERDIGITATED TRANSDUCERS

(75) Inventors: Aleh Loseu, Greensboro, NC (US); Jayanti Jaganatha Rao, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 188 days.

This patent is subject to a terminal disclaimer.

(21) Appl. No.: 11/431,991

(22) Filed: May 11, 2006

Related U.S. Application Data

(60) Provisional application No. 60/687,822, filed on Jun. 6, 2005, provisional application No. 60/684,015, filed on May 24, 2005.

(51) Int. Cl.
*H01L 41/08* (2006.01)

(52) U.S. Cl. .............. 310/313 D; 310/313 R; 310/313 B

(58) Field of Classification Search ............. 310/313 D; 333/195, 196
See application file for complete search history.

(56) References Cited

U.S. PATENT DOCUMENTS

| | | | | |
|---|---|---|---|---|
| 5,010,269 A * | 4/1991 | Hikita et al. | ............ | 310/313 B |
| 6,034,578 A * | 3/2000 | Fujita et al. | ................. | 333/193 |
| 6,353,372 B1 | 3/2002 | Baier et al. | | |
| 6,420,946 B1 | 7/2002 | Bauer et al. | | |
| 6,759,928 B2 | 7/2004 | Endou et al. | | |
| 6,801,100 B2 * | 10/2004 | Nakamura et al. | .......... | 333/133 |
| 6,853,113 B2 | 2/2005 | Bergmann | | |
| 6,861,927 B1 | 3/2005 | Abbott et al. | | |
| 7,019,435 B2 * | 3/2006 | Nakaya et al. | .......... | 310/313 D |
| 7,042,313 B2 * | 5/2006 | Yata | ........................... | 333/193 |
| 7,101,721 B2 | 9/2006 | Jorgenson et al. | | |

OTHER PUBLICATIONS

Sergei A. Doberstein et al., "Balanced Front-End Hybrid Saw Modules With Impedance Conversion," 2002 IEEE Ultrasonics Symposium, 2002, pp. 123-126, IEEE.
Takao Norita et al., "Wideband Low Loss Double Mode SAW Filters," 1992 Ultrasonics Symposium, 1992, pp. 95-104, IEEE.
Hiroyuki Nakamura et al., "A Design Technique of Balanced Longitudinal Coupled Mode SAW Filters for RF-stage with a Desired Matching Impedance," 2003 IEEE Ultrasonics Symposium, 2003, pp. 2097-2100, IEEE.

* cited by examiner

*Primary Examiner*—Mark Budd
(74) *Attorney, Agent, or Firm*—Withrow & Terranova, P.L.L.C.

(57) ABSTRACT

The present invention provides a surface acoustic wave (SAW) architecture wherein two acoustic reflectors are formed on a piezoelectric substrate to define an acoustic cavity between the acoustic reflectors. At least one alpha interdigitated transducer (IDT) may be provided, and at least three beta IDTs are provided. These IDTs are placed in acoustic series within the acoustic cavity. The alpha IDT is electrically coupled to a first interface. The beta IDTs are coupled in electrical and acoustic series and are associated with a second interface. In certain embodiments, the at least three beta IDTs are adjacent one another, while in other embodiments an additional reflector or an alpha IDT may be placed between two beta IDTs.

15 Claims, 12 Drawing Sheets

SAW ARCHITECTURE WITH SERIES CONNECTED INTERDIGITATED TRANSDUCERS

This application claims the benefit of U.S. provisional patent application Ser. No. 60/684,015, which was filed in the U.S. Patent and Trademark Office on May 24, 2005, and provisional patent application Ser. No. 60/687,822, which was filed in the U.S. Patent and Trademark Office on Jun. 6, 2005, which are incorporated herein by reference.

CROSS-REFERENCE TO RELATED APPLICATIONS

This application is related to concurrently filed application Ser. Nos. 11/431,988 entitled CENTER CHIRPING WITHIN SERIES CONNECTED INTERDIGITATED TRANSDUCERS, 11/431,986 entitled INTERLEAVED INTERDIGITATED TRANSDUCERS, and entitled 11/432,249 EDGE CHIRPING WITHIN SERIES CONNECTED INTERDIGITATED TRANSDUCERS, the disclosures of which are incorporated herein by reference.

FIELD OF THE INVENTION

The present invention relates to surface acoustic wave architectures, and in particular to a surface acoustic wave architecture with series connected interdigitated transducers.

BACKGROUND OF THE INVENTION

Surface acoustic wave (SAW) devices are often used in filtering applications for high-frequency signals. Of particular benefit is the ability to create low loss high order bandpass and notch filters without employing complex electrical filter circuits, which may require numerous active and passive components.

A common filtering application is in the transceiver circuitry of wireless communication devices. Often, an output of a first device is connected to an input of a SAW filter for filtering. The output of the SAW filter is generally associated with an output impedance, which is often different than the input impedance of a subsequent amplifier stage. As such, additional matching circuitry is used to provide an impedance transformation between the output of the SAW filter circuit and the input of the subsequent amplifier section. The inductive and capacitive elements used to form the matching network add significant cost to the design, and perhaps more importantly, take up space on the printed circuit board or module in which the circuit must be created. In mobile communications, there is always a need to decrease costs and minimize size. As such, there is a need for a more efficient technique to implement impedance matching in transceiver architectures.

Although SAW architectures have been used to provide minimalistic impedance transformations, the extent of the impedance transformation has traditionally been limited due to performance degradation. As the extent of the impedance transformation increases, the SAW architecture will inject significant losses into the signal being filtered. Further, the passband of the resultant filter may take on unfavorable characteristics, such as bandwidth narrowing or degradation in passband shape.

As such, there is a further need to provide a SAW architecture that is capable of supporting greater impedance transformations while minimizing losses to the signal being filtered and the injection of unwanted characteristics in the passband.

SUMMARY OF THE INVENTION

The present invention provides a surface acoustic wave (SAW) architecture wherein two acoustic reflectors are formed on a piezoelectric substrate to define an acoustic cavity between the acoustic reflectors. At least one alpha interdigitated transducer (IDT) may be provided, and at least three beta IDTs are provided. These IDTs are placed in acoustic series within the acoustic cavity. The alpha IDT is electrically coupled to a first interface. The beta IDTs are coupled in electrical and acoustic series and are associated with a second interface. In certain embodiments, the at least three beta IDTs are adjacent one another, while in other embodiments an additional reflector or an alpha IDT may be placed between two beta IDTs.

Edge chirping may be employed in adjacent edge portions of adjacent beta IDTs. Traditional edge chirping may be provided in adjacent edge portions of adjacent alpha and beta IDTs. In another embodiment, the at least three beta IDTs include two outer beta IDTs and an inner beta IDT located between the two outer beta IDTs. The inner beta IDTs may be chirped in a center portion, wherein the area outside of the center portion is not chirped. Again, traditional edge chirping may be provided in adjacent edge portions of adjacent alpha and beta IDTs. When center chirping is employed, the outer beta IDTs are preferably not chirped in center portions.

The first and second interfaces may serve either as inputs or outputs to the overall SAW architecture. Notably, the SAW architectures are generally reciprocal, wherein either interface may serve as an output or an input, depending on the application in which the SAW architecture is employed.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
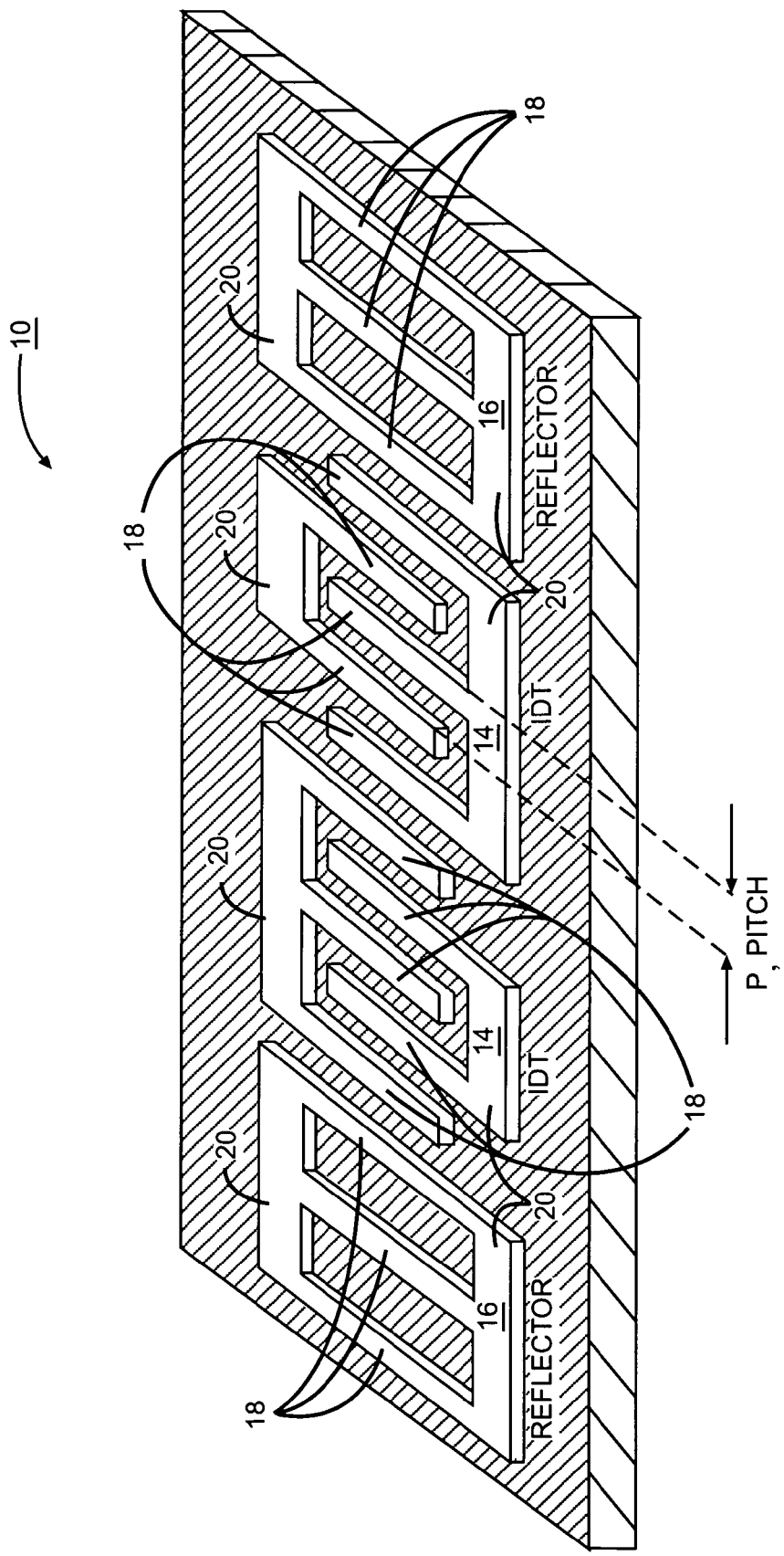
FIG. 1 illustrates a basic SAW architecture according to the prior art.

With reference to FIG. 1, a typical SAW architecture 10 is illustrated. The SAW architecture 10 will generally include a piezoelectric substrate 12, which has a surface on which various types of SAW elements may be formed. As illustrated, a dual-mode SAW (DMS) architecture is provided, wherein at least two inter-digital transducers (IDT) 14 are placed between two inter-digital reflectors 16. Both the IDTs 14 and the reflectors 16 include a number of fingers 18 that are connected to opposing bus bars 20. For the reflectors 16, all of the fingers 18 connect to each bus bar 20. For the IDTs 14, alternating fingers 18 are connected to different bus bars 20, as depicted. Notably, the reflectors 16 and IDTs 14 generally have a much larger number of fingers 18 than depicted. The number of actual fingers 18 has been significantly reduced in the drawing figures in an effort to more clearly depict the overall concepts employed in available SAW architecture as well as the concepts provided by the present invention.

Notably, the fingers 18 are parallel to one another and aligned within an acoustic cavity, which essentially encompasses the area in which the reflectors 16 and the IDTs 14 reside. In this acoustic cavity, the standing wave or waves generated when the IDTs 14 are excited with electrical signals essentially reside within the acoustic cavity. As such, the acoustic wave energy essentially runs perpendicular across the various fingers 18. In the embodiment illustrated in FIG. 1, one IDT 14 may act as an input while the other IDT 14 may act as an output for electrical signals. Notably, the IDTs 14 and the reflectors 16 are oriented in acoustic series, such that the acoustic wave energy moves along the cavity and perpendicularly across the respective fingers 18 of the IDTs 14 and the reflectors 16.

Figure 2:
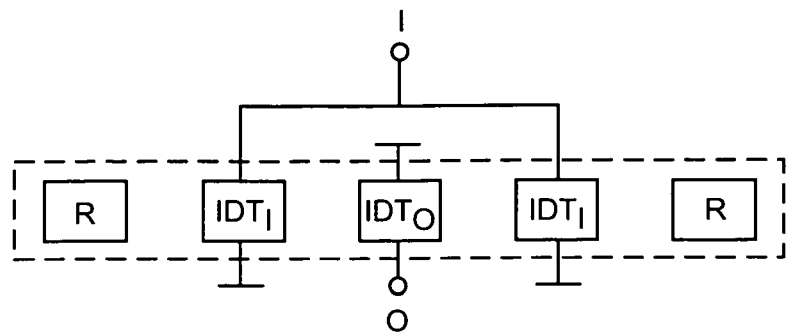
FIG. 2 is a block representation of a SAW filter architecture according to the prior art.

Depending on how the IDTs 14 are acoustically and electrically connected, SAW architectures 10 can provide electrical impedance transformations between input and output ports in addition to filtering electrical signals. With reference to FIG. 2, two input IDTs 14 ($IDT_I$) and one output IDT 14 ($IDT_O$) are aligned between two reflectors 16 (R) within an acoustic cavity represented by the area within the dashed line. The output IDT 14 ($IDT_O$) is placed between the input IDTs 14 ($IDT_I$). The input IDTs 14 ($IDT_I$) are coupled to an input I and are electrically parallel to one another. An output port O is coupled to the output IDT 14 ($IDT_O$). Notably, the input IDTs 14 and the output IDT 14 are oriented in acoustic series. In addition to being able to filter an input signal to provide a filtered output signal, the electrical input impedance is different than the electrical output impedance. Assuming each of the IDTs 14 ($IDT_I$ and $IDT_O$) has substantially the same electrical impedance, the impedance transformation is represented as follows:

Electrical input impedance=z/2, because the input IDTs ($IDT_I$) are in parallel.     Eq. 1

Electrical output impedance=z     Eq. 2

$$\text{Ratio of electrical input impedance to output impedance} = \frac{z/2}{z} = \frac{1}{2} \quad \text{Eq. 3}$$

Unfortunately, the SAW architectures 10 of the prior art are somewhat limited in their ability to provide significant differences between the electrical input impedance and the electrical output impedance. The present invention provides techniques to provide greater electrical impedance transformations with little or no performance degradation of the SAW architecture 10.

Figure 3:
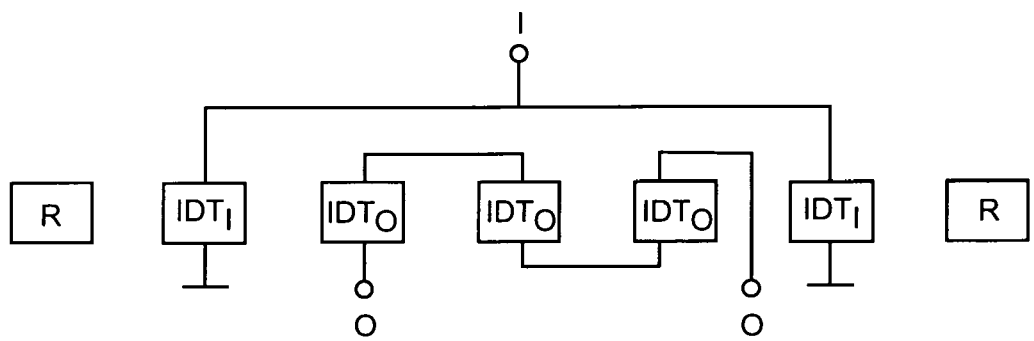
FIG. 3 is a block representation of a SAW filter architecture according a first embodiment of the present invention.

With reference to FIG. 3, one embodiment of the present invention provides for connecting three output IDTs 14 (IDTO) in electrical series within a DMS configuration. Again, the DMS configuration is one where input IDTs 14 (IDTI) and output IDTs 14 (IDTO) are between and in acoustic series with two reflectors 16 (R). In the embodiment illustrated in FIG. 3, the three output IDTs 14 (IDTO), which are connected in electrical series and acoustic series, are between and in acoustic series with two input IDTs 14 (IDTI). The impedance transformation for the SAW architecture 10 of FIG. 3 is as follows:

$$\frac{\text{Input electrical impedance}}{\text{Output electrical impedance}} = \frac{z/2}{3z} = \frac{1}{6} \quad \text{Eq. 4}$$

-continued $$\frac{\text{Input electrical impedance}}{\text{Output electrical impedance}} = \frac{z/2}{4z} = \frac{1}{8} \quad \text{Eq. 5}$$

Figure 4A:
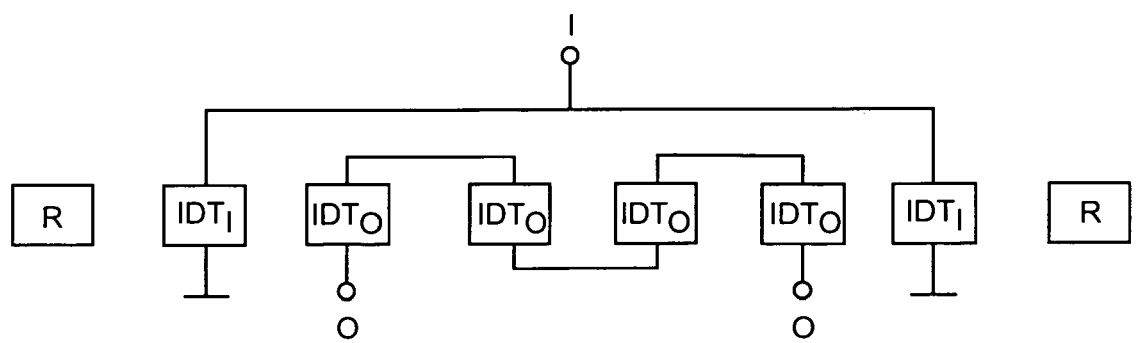
FIGS. 4A and 4B are block representations of SAW filter architectures according a second embodiment of the present invention.
Figure 4B:
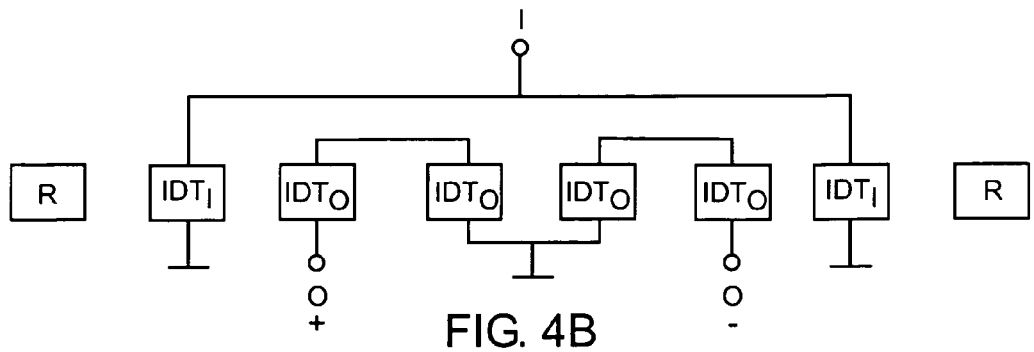
Figure 5A:
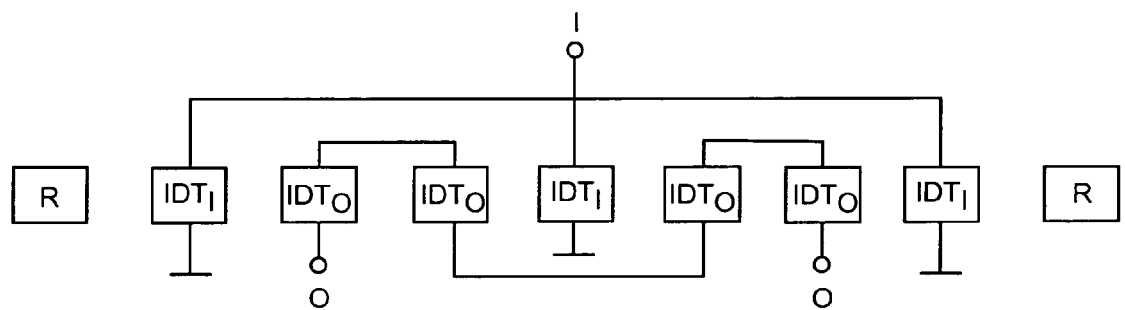
FIGS. 5A and 5B are block representations of SAW filter architectures according a third embodiment of the present invention.
Figure 5B:
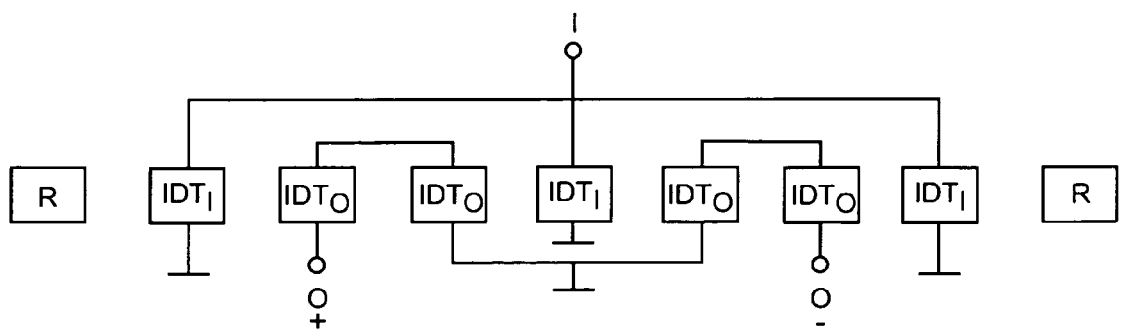
Figure 6A:
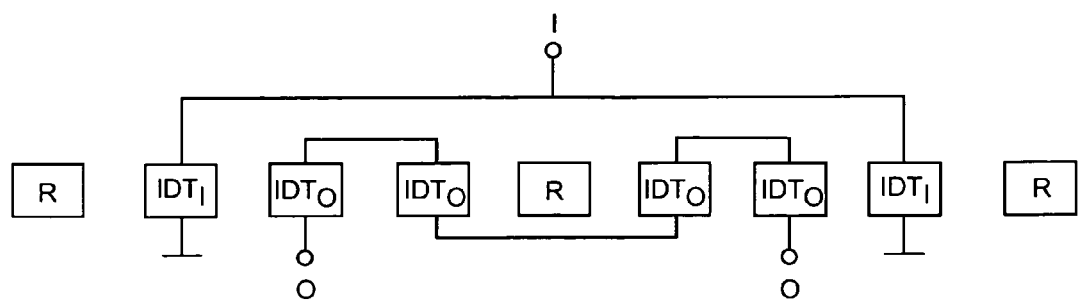
FIGS. 6A and 6B are block representations of SAW filter architectures according a fourth embodiment of the present invention.
Figure 6B:
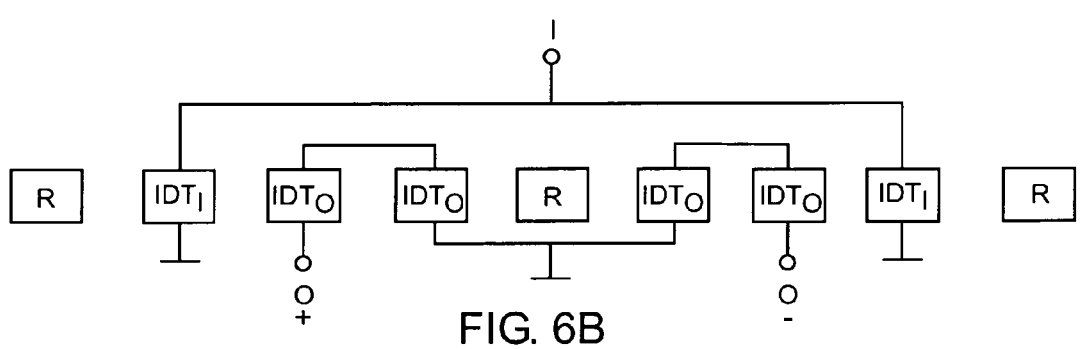

Turning now to FIG. 4A, any number of output IDTs 14 (IDTO) can be connected in electrical and acoustic series with each other within the DMS architecture 10. In FIG. 4B, the center point between the central IDTs (IDTO) is grounded. This point is generally near zero potential in a differential output configuration. In short, three or more output IDTs 14 (IDTO) can be connected in electrical and acoustic series with each other within the DMS architecture 10. With reference to FIG. 5A, the output IDTs 14 (IDTO) that are connected in electrical and acoustic series need not be adjacent to one another. As depicted, there are three input IDTs 14 (IDTI). In FIG. 5B, the center point between the central IDTs (IDTO) is grounded. This point is generally near zero potential in a differential output configuration. Two of the input IDTs 14 (IDTI) are just inside the reflectors 16 (R), wherein the third input IDT 14 (IDTI) is between adjacent pairs of output IDTs 14 (IDTO). As illustrated in FIG. 6A, the three or more output IDTs 14 (IDTO) that are in electrical and acoustic series may be separated by a mid-cavity reflector 16 (R'). In FIG. 6B, the center point between the central IDTs (IDTO) is grounded. This point is generally near zero potential in a differential output configuration.

To enhance the passband characteristics of SAW architectures 10, a technique referred to as "chirping" has been employed to manipulate the standing waves within the acoustic cavity. To date, chirping has only been employed on the outside edges of an IDT 14. Further, only the edges that are at the junction of an input IDT 14 (IDTI) and an output IDT 14 (IDTO) have been chirped. Chirping is the process of varying the pitch (P) in an IDT 14 within a chirping region. The sum of the width of a finger and the space between two adjacent fingers 18 of an IDT 14 or reflector 16 is generally referred to as a pitch. As such, chirping entails varying the pitch in a chirping region. In one embodiment, the length of chirping may range from one period to twelve periods where a period is the pitch of the non-chirped fingers.

Figure 7:
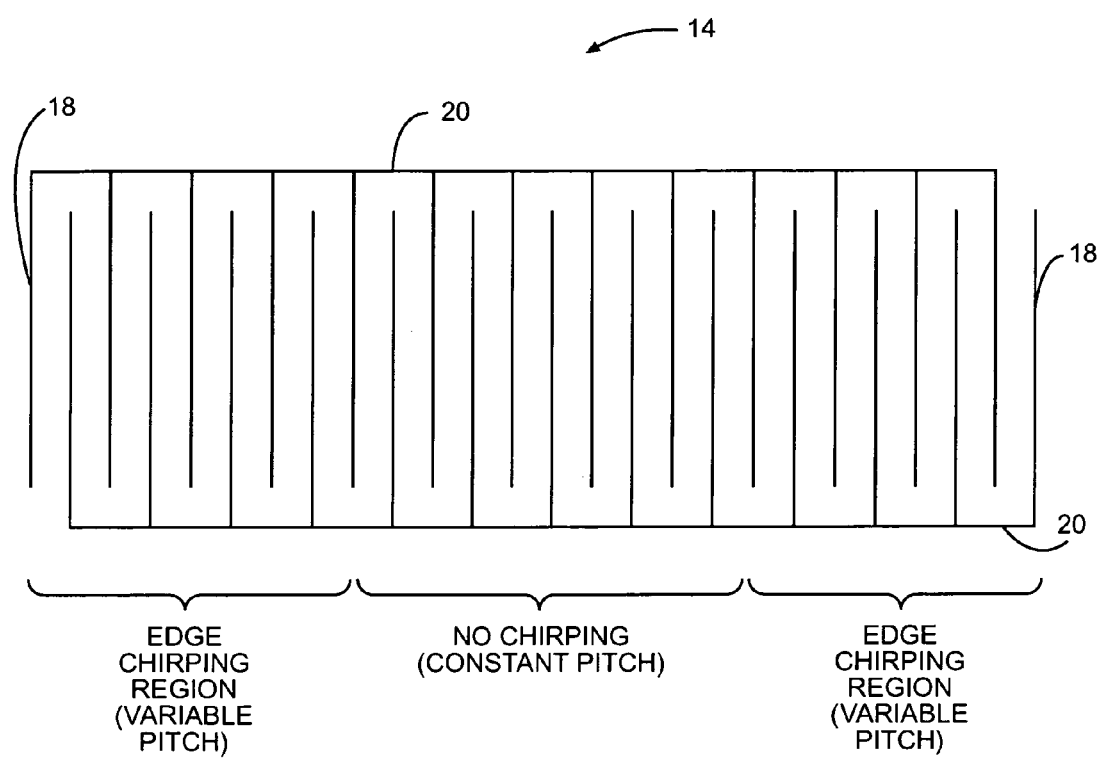
FIG. 7 illustrates edge chirping for a given IDT according to one embodiment of the present invention.

With reference to FIG. 7, there are edge chirping regions at the respective edges of the IDT 14 where the pitch varies throughout respective edge chirping regions. Between the edge chirping regions, there is no chirping and there is a constant pitch among the fingers 18. As such, the fingers 18 are equally spaced where there is no chirping. As will be described in further detail below, the present invention employs edge chirping at the adjacent edges of output IDTs 14 (IDTO) that are in electrical and acoustic series. Traditional edge chirping techniques between the adjacent edges of input IDTs 14 (IDTI) and output IDTs 14 (IDTO) may also be employed.

Figure 8:
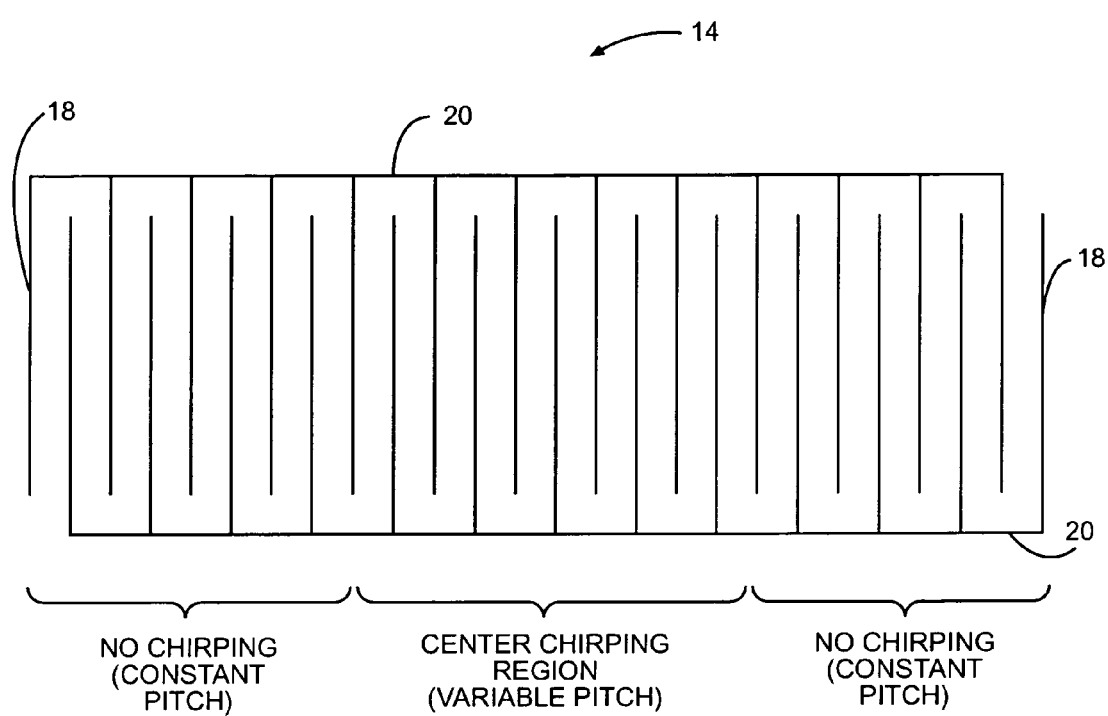
FIG. 8 illustrates center chirping for a given IDT according to one embodiment of the present invention.

With reference to FIG. 8, another embodiment of the present invention employs chirping in a central region of an IDT 14. In essence, throughout a center chirping region of the IDT 14, the pitch of the fingers 18 is varied. For the remaining portions of the IDT 14, there is no chirping. As such, there is a constant pitch among the fingers 18 in the other regions.

Figure 9:
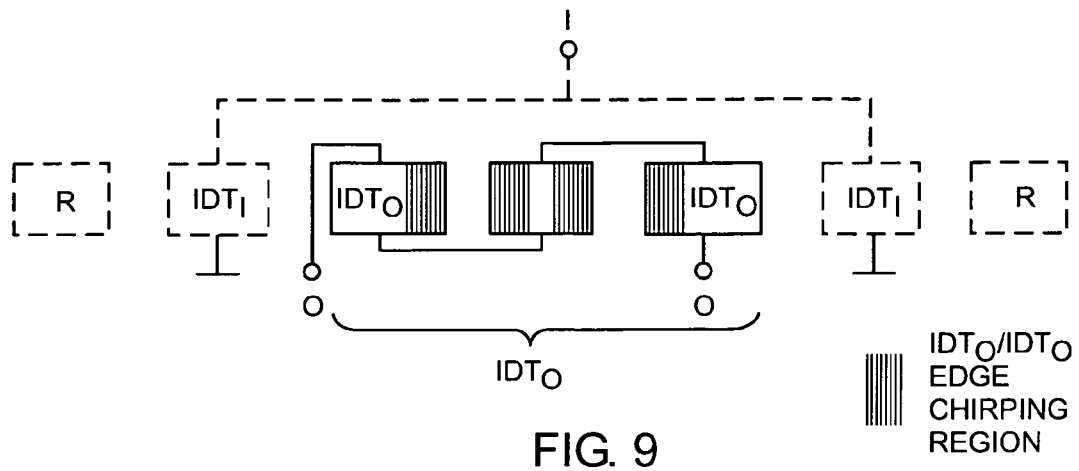
FIG. 9 is a block representation of a SAW filter architecture according to a fifth embodiment of the present invention.
Figure 10A:
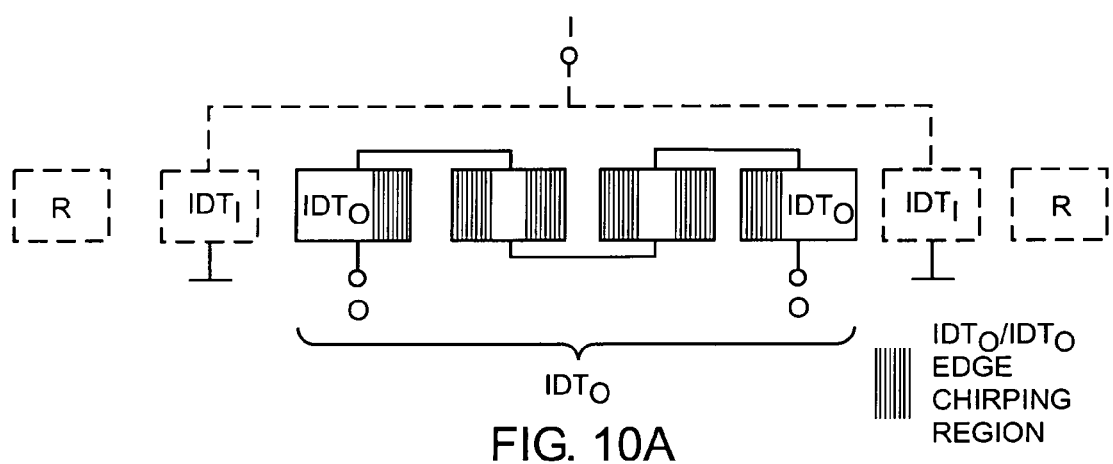
FIGS. 10A and 10B are block representations of SAW filter architectures according to a sixth embodiment of the present invention.
Figure 10B:
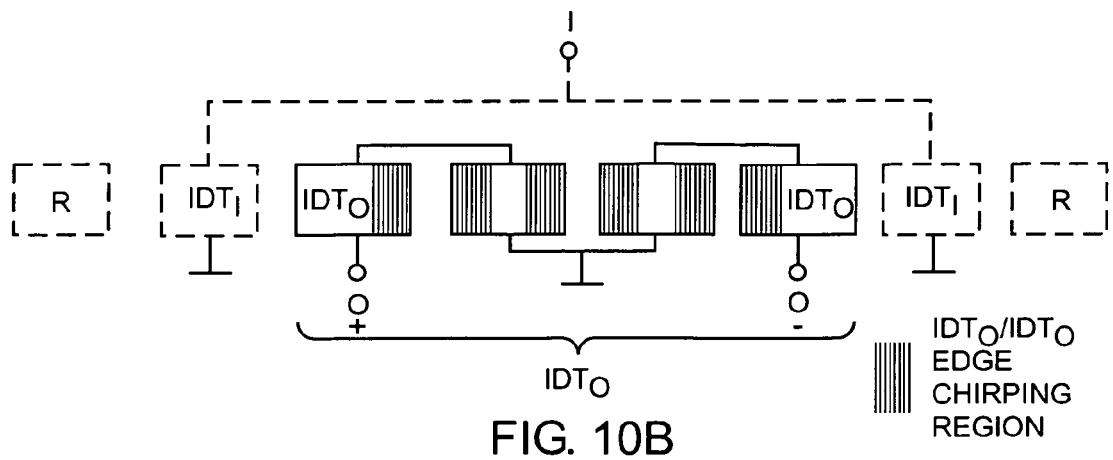

Applications of the novel chirping techniques of the present invention are now illustrated in FIGS. 9-14. With reference to FIG. 9, a DMS architecture 10 is illustrated where three output IDTs 14 (IDTO) are in electrical and acoustic series. Notably, at the edges of output IDTs 14 (IDTO) that are adjacent one another, edge chirping is employed. The output IDT to output IDT (IDTO/IDTO) edge chirping regions are shaded. Turning to FIG. 10A, there are four output IDTs 14 (IDTO) in electrical and acoustic series in a DMS architecture 10. Again, edge chirping is employed at the edges of the output IDTs 14 (IDTO) that are adjacent to other output IDTs 14 (IDTO). In FIG. 10B, the center point between the central IDTs (IDTO) is grounded. This point is generally near zero potential in a differential output configuration.

Figure 11:
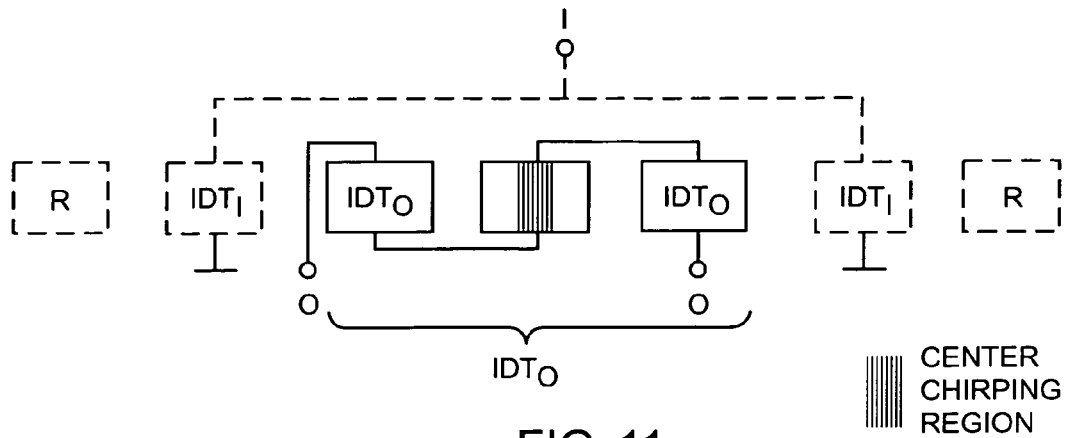
FIG. 11 is a block representation of a SAW filter architecture according to a seventh embodiment of the present invention.
Figure 12A:
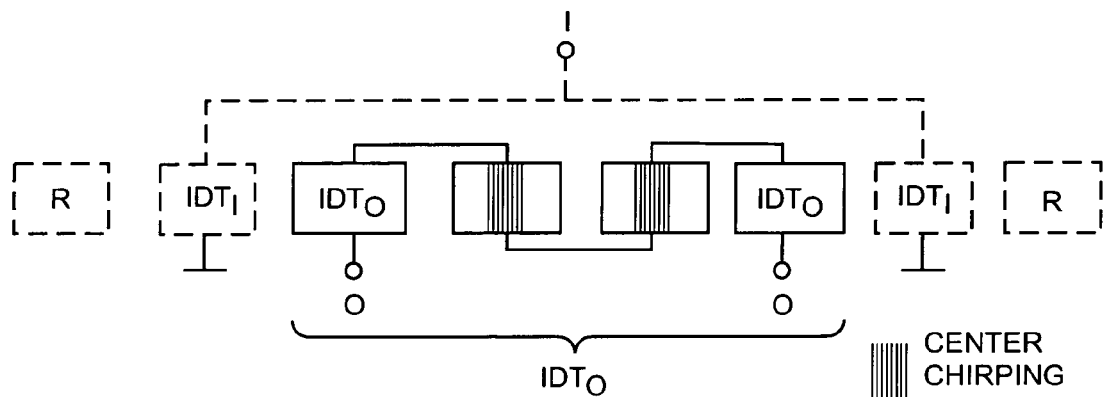
FIGS. 12A and 12B are block representations of SAW filter architectures according to a eighth embodiment of the present invention.
Figure 12B:
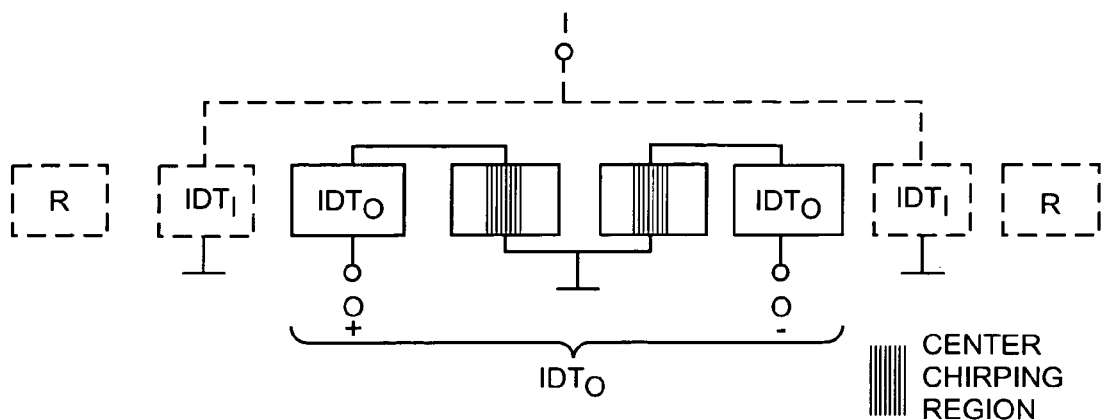

Turning now to FIG. 11, the central chirping technique is illustrated in a DMS architecture 10 where there are three output IDTs 14 (IDTO) in electrical and acoustic series. Notably, only the central output IDT 14 (IDTO) has a center chirping region. The outside output IDTs 14 (IDTO) do not employ center chirping and will not have a center chirping region. Regardless of the number of output IDTs 14 (IDTO) in electrical and acoustic series, only those output IDTs 14 (IDTO) that are located between two or more output IDTs 14 (IDTO) will employ center chirping. For example, the DMS architecture of FIG. 12A only employs center chirping in the center two output IDTs 14 (IDTO), and not in the two outside output IDTs 14 (IDTO). In FIG. 12B, the center point between the central IDTs (IDTO) is grounded. This point is generally near zero potential in a differential output configuration.

Figure 13:
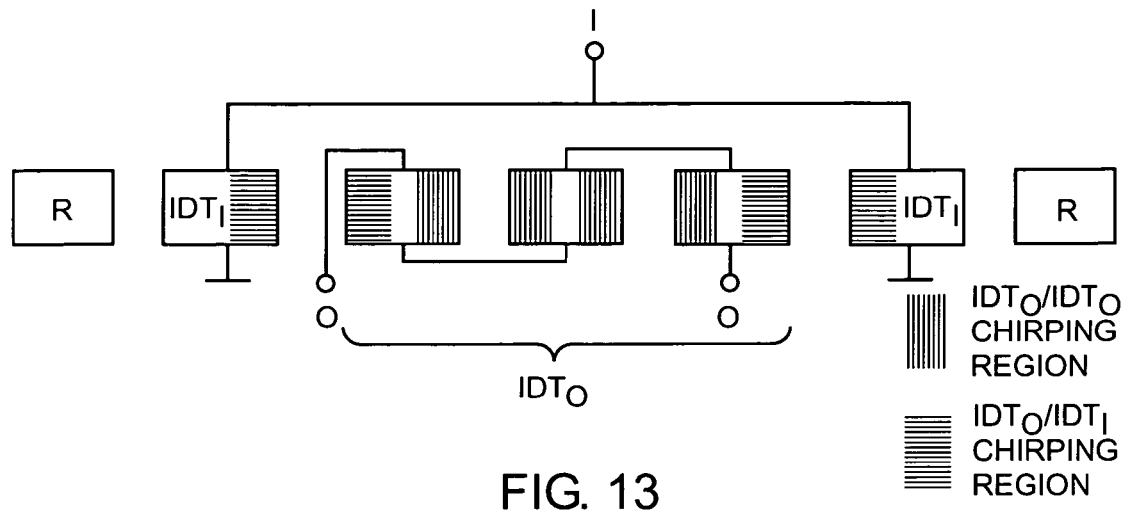
FIG. 13 is a block representation of a SAW filter architecture according to a ninth embodiment of the present invention.

As noted, the new chirping techniques provided by the present invention may be employed in combination with traditional chirping techniques, which have been reserved for the adjacent edges of input IDTs 14 (IDTI) and output IDTs 14 (IDTO). With reference to FIG. 13, the adjacent edges of adjacent output IDTs 14 (IDTO) are chirped in an IDTO/IDTO chirping region according to the present invention. The adjacent edges of adjacent output IDTs 14 (IDTO) and input IDTs 14 (IDTI) are chirped in an IDTO/IDTI chirping region.

Figure 14:
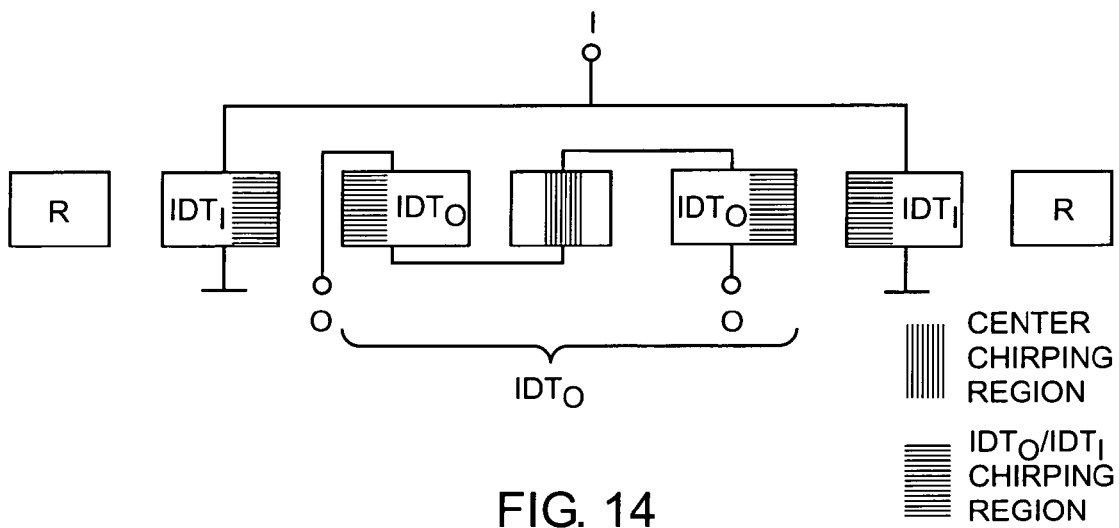
FIG. 14 is a block representation of a SAW filter architecture according to a tenth embodiment of the present invention.

With reference to FIG. 14, center chirping within a center region is only provided in the center output IDT 14 (IDTO), which is one of three output IDTs 14 (IDTO) in electrical and acoustic series. Notably, the outermost output IDTs 14 (IDTO) do not employ center chirping, as discussed above. However, traditional chirping techniques may be employed at adjacent edges of adjacent output IDTs 14 (IDTO) and input IDTs 14 (IDTI) in IDTO/IDTI chirping regions.

Figure 15:
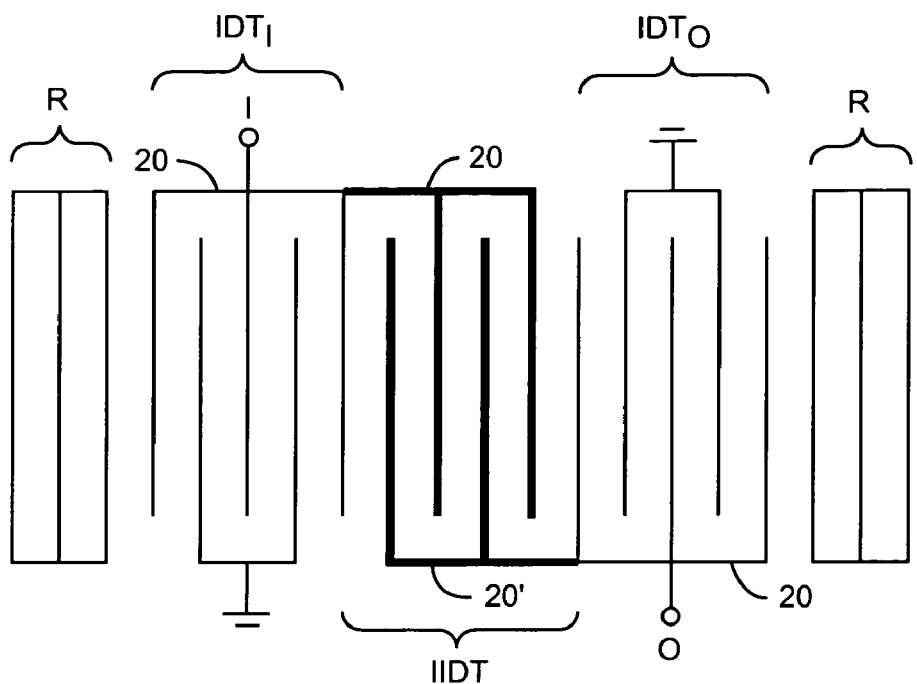
FIG. 15 is a graphical illustration of an interleaved IDT within a SAW filter architecture.

In yet another embodiment of the present invention, an interleaved IDT (IIDT) is connected to both an input IDT 14 (IDTI) and an output IDT 14 (IDTO) via corresponding bus bars 20. This technique is illustrated in FIG. 15, where the IIDT is highlighted in bold. In essence, a first bus bar 20' of the IIDT is connected to the bus bar 20 of the input IDT 14 (IDTI), and another bus bar 20' of the IIDT is connected to a bus bar 20 of the output IDT 14 (IDTO). Notably, the IIDT is coupled electrically to the respective input and output ports of the overall DMS architecture 10. Accordingly, the bus bars 20 of the respective input and output IDTs 14 are effectively extended such that the adjacent edges of the respective input and output IDTs 14 partially overlap one another in an interdigitated fashion.

Figure 16:
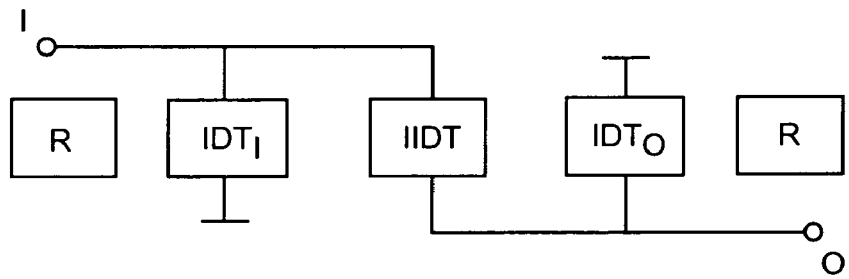
FIG. 16 is a block representation of a SAW filter architecture according to a eleventh embodiment of the present invention.
Figure 17:
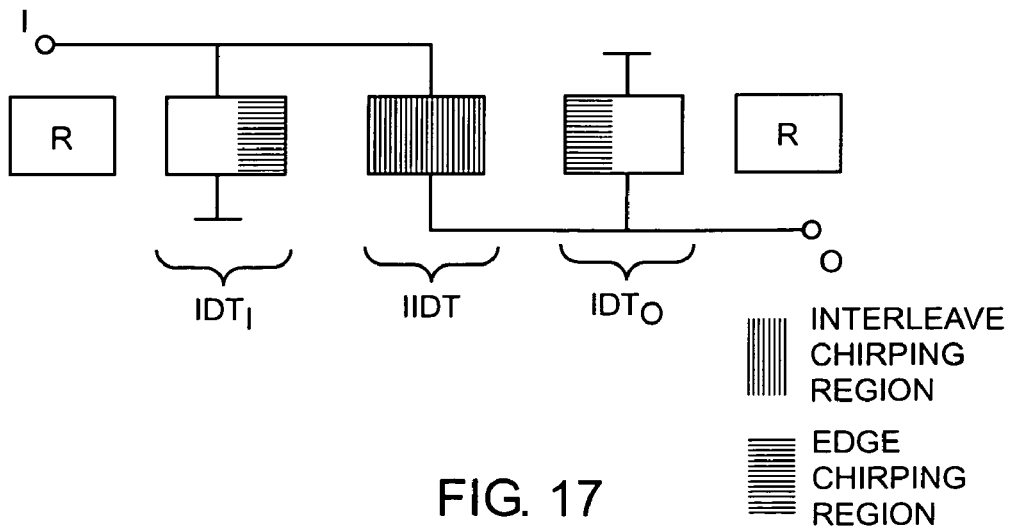
FIG. 17 is a block representation of a SAW filter architecture according to a twelfth embodiment of the present invention.

Chirping may be applied to the interleaved DMS architecture illustrated in FIG. 16. With reference to FIG. 17, the IIDT may employ chirping throughout its fingers 18, such that the pitch varies throughout the IIDT. Further, the edges of the input IDT 14 (IDTI) and the output IDT 14 (IDTO) are chirped throughout an edge chirping region, which is immediately adjacent the IIDT.

Figure 18:
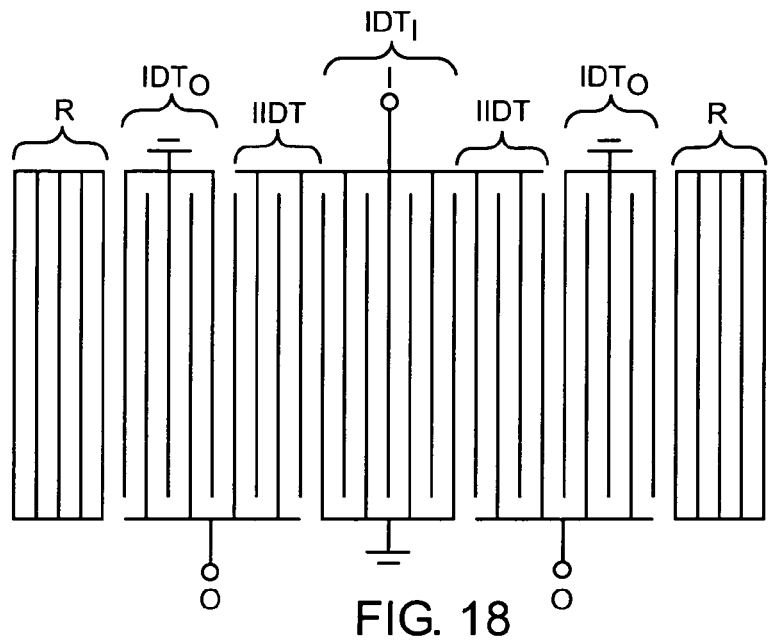
FIG. 18 is a block representation of multiple interleaved IDTs within a SAW filter architecture.
Figure 19:
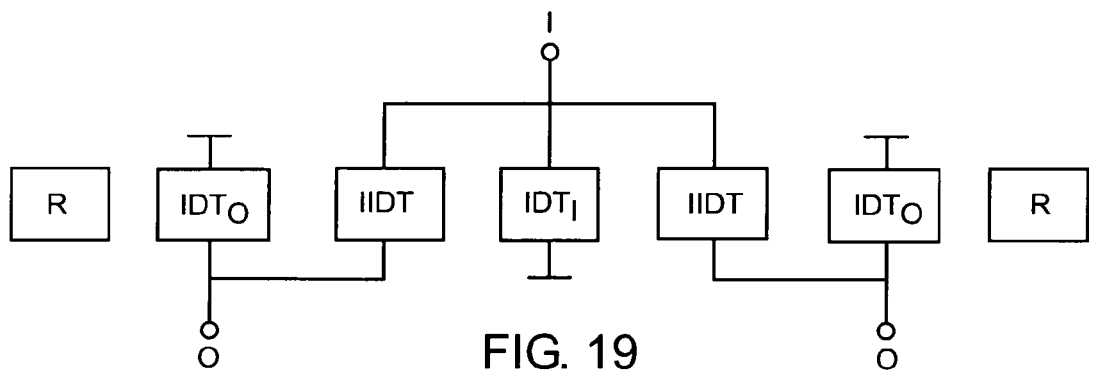
FIG. 19 is a block representation of a SAW filter architecture according to a thirteenth embodiment of the present invention.
Figure 20:
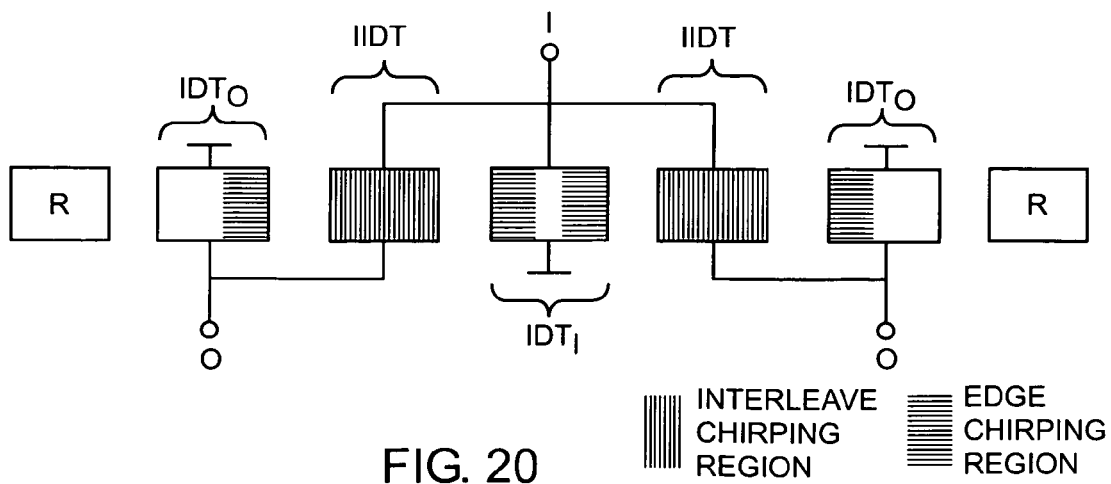
FIG. 20 is a block representation of a SAW filter architecture according to a fourteenth embodiment of the present invention.

With reference to FIG. 18, another example of an interleaved DMS architecture 10 is provided. A central input IDT 14 (IDTI) provides a single-ended input and two output IDTs 14 (IDTO) provide two outputs. IIDTs are provided between the input IDT 14 (IDTI) and the output IDTs 14 (IDTO) as described above. Reflectors 16 (R) frame the interleaved DMS architecture. FIG. 19 provides a block representation of the interleaved DMS architecture of FIG. 18. FIG. 20 illustrates how chirping may be employed in such an architecture. In particular, chirping is employed throughout the IIDTs and edge chirping is provided at the edges of either the input IDT 14 (IDTI) or the output IDTs 14 (IDTO) immediately adjacent to the IIDTs.

Figure 21A:
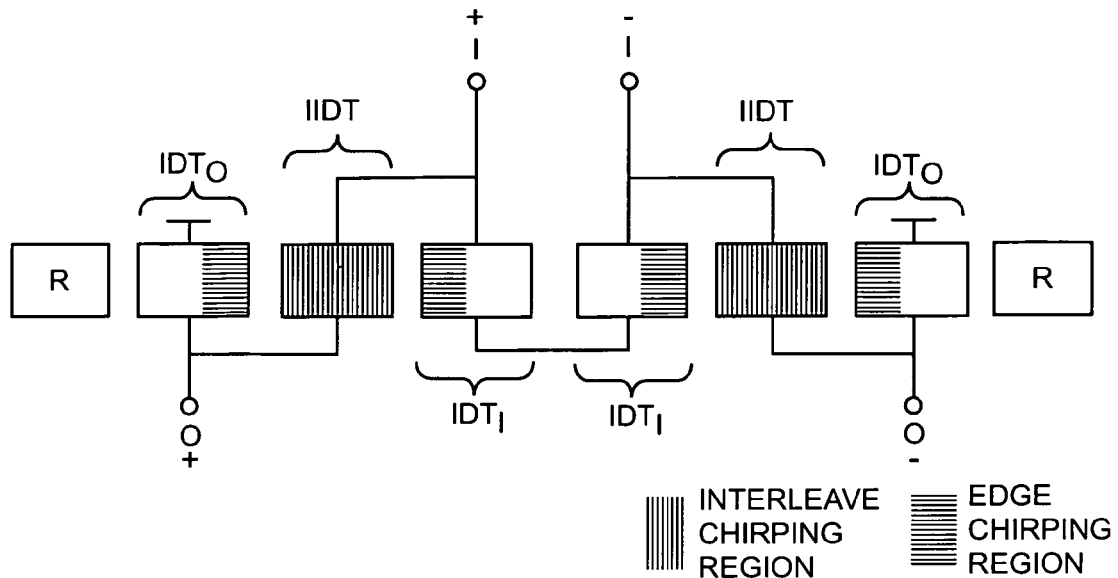
FIGS. 21A and 21B are block representations of SAW filter architectures according to a fifteenth embodiment of the present invention.
Figure 21B:
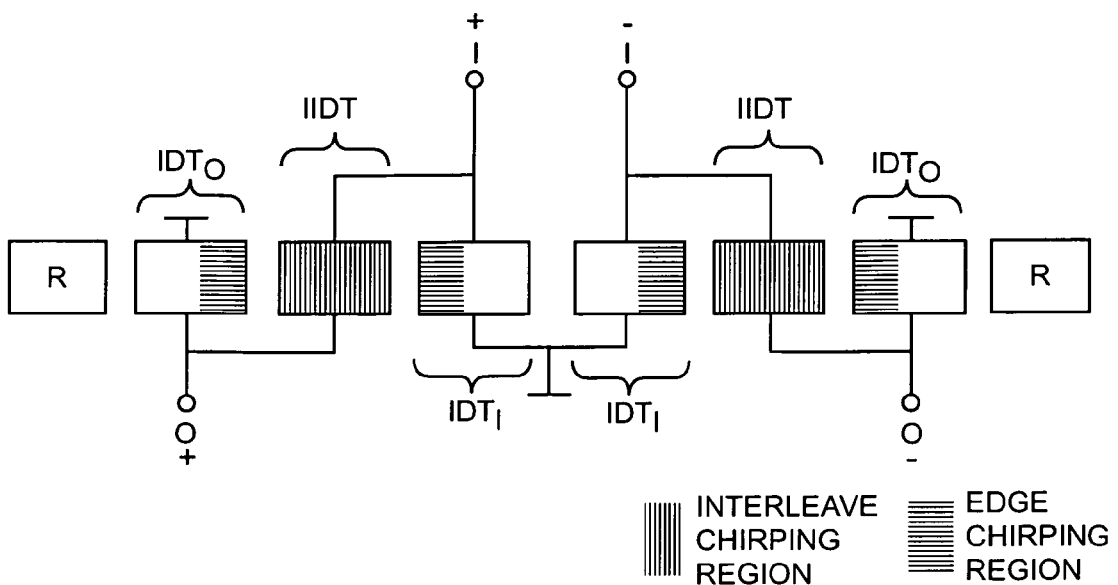

With reference to FIG. 21A, another example of an interleaved DMS architecture 10 is provided. The two inner input IDTs 14 (IDTI) provide a differential input and the two outer output IDTs 14 (IDTO) provide a differential output. In FIG. 21B, the center point between the central IDTs (IDTO) is grounded. This point is generally near zero potential in a differential output configuration.

Those skilled in the art will recognize that the SAW architectures discussed above are essentially reciprocal, such that the inputs in one application may serve as the outputs in another. As such, the nomenclature used to delineate input and output interfaces in the above embodiments are used merely for readability.

Those skilled in the art will recognize improvements and modifications to the preferred embodiments of the present invention. All such improvements and modifications are considered within the scope of the concepts disclosed herein and the claims that follow.

What is claimed is:

1. A surface acoustic wave device comprising:
   a piezoelectric substrate;
   two acoustic reflectors formed on the piezoelectric substrate and defining an acoustic cavity between the acoustic reflectors;
   at least one alpha interdigitated transducer (IDT) formed on the piezoelectric substrate between the acoustic reflectors and electrically coupled to a first interface;
   at least three beta IDTs formed on the piezoelectric substrate between the acoustic reflectors and electrically coupled to a second interface; and
   each of the at least three beta IDTs coupled in electrical series with each other and aligned in acoustic series with each other and with the at least one alpha IDT within the acoustic cavity.

2. The surface acoustic wave device of claim 1 wherein the at least one alpha IDT comprises at least two alpha IDTs coupled in electrical parallel with each other and aligned in acoustic series with each other.

3. The surface acoustic wave device of claim 1 wherein adjacent edge portions of at least two of the at least three beta IDTs are chirped.

4. The surface acoustic wave device of claim 3 wherein center portions of the at least two of the at least three beta IDTs are not chirped.

5. The surface acoustic wave device of claim 4 wherein adjacent edges of the at least one alpha IDT and at least one of the at least three beta IDTs are chirped.

6. The surface acoustic wave device of claim 1 wherein the at least three beta IDTs are adjacent each other and comprise at least one inner beta IDT between two outer beta IDTs, a center portion of the at least one inner beta IDT being chirped.

7. The surface acoustic wave device of claim 6 wherein edge portions of the at least one inner beta IDT are not chirped.

8. The surface acoustic wave device of claim 6 wherein center portions of the at least two outer beta IDTs are not chirped.

9. The surface acoustic wave device of claim 8 wherein adjacent edges of the at least one alpha IDT and at least one of the at least three beta IDTs are chirped.

10. The surface acoustic wave device of claim 1 further comprising an additional acoustic reflector located in acoustic series with and between two of the at least three beta IDTs.

11. The surface acoustic wave device of claim 1 wherein the at least one alpha IDT is located in acoustic series with and between two of the at least three beta IDTs.

12. The surface acoustic wave device of claim 1 wherein the first interface is associated with a first electrical impedance and the second interface is associated with a second electrical impedance, such that an electrical impedance transformation is provided between the first interface and the second interface.

13. The surface acoustic wave device of claim 1 wherein the at least one alpha IDT and the at least three beta IDTs cooperate to provide a filter response between the first interface and the second interface.

14. The surface acoustic wave device of claim 1 wherein the first interface is an input and the second interface is an output.

15. The surface acoustic wave device of claim 1 wherein the first interface is an output and the second interface is an input.

* * * * *